(12) United States Patent
Chu et al.

(10) Patent No.: US 7,418,638 B2
(45) Date of Patent: Aug. 26, 2008

(54) SEMICONDUCTOR MEMORY DEVICE AND METHOD FOR TESTING MEMORY CELLS USING SEVERAL DIFFERENT TEST DATA PATTERNS

(75) Inventors: Yong-gyu Chu, Seoul (KR); Bu-yeal Jung, Yonin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 11/348,474

(22) Filed: Feb. 7, 2006

(65) Prior Publication Data

US 2006/0179370 A1 Aug. 10, 2006

(30) Foreign Application Priority Data

Feb. 7, 2005 (KR) .................. 10-2005-0011442

(51) Int. Cl.
*G11C 29/00* (2006.01)
(52) U.S. Cl. ..................................... 714/719
(58) Field of Classification Search ............... 714/718, 714/719
See application file for complete search history.

(56) References Cited

U.S. PATENT DOCUMENTS

| | | | | |
|---|---|---|---|---|
| 6,256,243 B1 * | 7/2001 | Savignac et al. | ............ | 365/201 |
| 6,408,412 B1 * | 6/2002 | Rajsuman | .................... | 714/724 |
| 6,636,998 B1 * | 10/2003 | Lee et al. | .................... | 714/735 |
| 2004/0153910 A1 | 8/2004 | Thalmann et al. | | |

FOREIGN PATENT DOCUMENTS

| | | |
|---|---|---|
| JP | 05-012900 | 1/1993 |
| KR | 2001-0040999 | 5/2001 |
| KR | 1020040036523 A | 4/2004 |

* cited by examiner

*Primary Examiner*—James C Kerveros
(74) *Attorney, Agent, or Firm*—Harness, Dickey & Pierce

(57) ABSTRACT

There is provided a memory device in which memory cells may be tested using several different test data patterns. The memory device may include a switch unit, a plurality of storage units, and a selector. The switch unit may transfer bits of data received in response to a mode control signal to memory cells or transfers bits of test data to the memory cells. The plurality of storage units respectively stores bits of test data in response to bits of an input control signal. The selector applies test data stored in one of the storage units to the switch unit in response to the input control signal.

17 Claims, 4 Drawing Sheets

SEMICONDUCTOR MEMORY DEVICE AND METHOD FOR TESTING MEMORY CELLS USING SEVERAL DIFFERENT TEST DATA PATTERNS

PRIORITY CLAIM

A claim of priority is made to Korean Patent Application No. 10-2005-0011442, filed on Feb. 7, 2005, in the Korean Intellectual Property Office, the disclosure of which is incorporated herein in its entirety by reference.

BACKGROUND OF THE INVENTION

1. Field of the Invention

Example embodiments of the present invention generally relate to a semiconductor memory device. More particularly, example embodiment of the present invention relate to a semiconductor memory device in which memory cells are tested using several different test data patterns and method thereof.

2. Description of the Related Art

As the capacity of a semiconductor memory device has increased, so has the time required to test the semiconductor memory device. Accordingly, in order to reduce the test time, several semiconductor memory devices may be tested at the same time using a single test apparatus.

The number of input/output (I/O) pins capable of being tested by a single test apparatus is fixed, therefore, to test additional semiconductor memory devices at the same time, it may be necessary to reduce the number of I/O pins allocated to a memory device.

To test a semiconductor memory device using fewer number of I/O pins, the semiconductor memory device may be adapted to operate in a test mode in addition to a normal mode. In the test mode, the semiconductor memory device may process and output several internal parallel data through the I/O pins, and may expand and write data received through the I/O pins as parallel data.

However, when data received through the fewer number of I/O pins are expanded and several internal parallel data are generated, data patterns capable of being written in memory cells may not be varied.

FIG. 1 illustrates a conventional semiconductor memory device 100 capable of expanding input data and generating parallel data.

Referring to FIG. 1, the memory device 100 may include a plurality of transmission gates TG11 to TG116 and TG21 to TG216. In a normal mode, the transmission gates TG11 to TG116 in response to a normal mode signal MODE_N may transfer received data DIN1 to DIN16 to corresponding memory cells (not shown). The normal mode signal MODE_N may be applied to NMOS transistors of the transmission gates TG11 to TG116, and an inverted normal signal MODE_N, inverted by an inverter 11, may be applied to PMOS transistors of the transmission gates TG11 to TG116.

During a test mode, the transmission gates TG21 to TG216 may apply received data DIN1, DIN5, DIN9, and DIN13 in response to a test mode signal MODE_T to corresponding memory cells (not shown).

The test mode signal MODE_T may be applied to NMOS transistors of the transmission gates TG21 to TG216, and an inverted test mode signal MODE_T, inverted by an inverter 12, may be applied to PMOS transistors of the transmission gates TG21 to TG216.

As described above, in order for a single test apparatus to test several semiconductor memory devices at one time, the number of I/O pins allocated to a memory device must be reduced. The memory device 100 illustrated in FIG. 1 has an "×16" organization in which 16 data bits may be input/output at the same time, and the number of I/O pins used during the testing may be four.

The memory device 100 takes the four data DIN1, DIN5, DIN9, and DIN13 in a test mode and generates (expands) 16 data DATA1 to DATA16 to be applied to the memory cells. The data DATA1 to DATA16 may be respectively written to the corresponding memory cells.

Since the memory device 100 uses only four input data DIN1, DIN5, DIN9, and DIN13 during a test mode, the same value as the input data DIN1 may be written to the memory cells to which data DATA1, DATA2, DATA3, and DATA4 may be applied.

Likewise, the same value as the input data DIN5 may be written to the memory cells to which data DATA5, DATA6, DATA7, and DATA8 may be applied. This process also applies to DIN9 and DIN13.

In general, in order to detect a defective semiconductor memory device, several different test data patterns may be required. However, as described above, it may not possible for the semiconductor memory test circuit 100 with the "×16" organization to have a value data DATA1 that is different than a value of data DATA2. In the memory device 100, the number of test data patterns capable of being used in a test mode may be limited.

FIG. 2 illustrates a conventional test data pattern generator 200.

As described above with respect to the memory device 100 of FIG. 1, the number of test data patterns may be limited.

In order to solve the problem of the limited test data patterns available during a test mode, an address key method of combining input data DIN1 to DINn with dummy addresses ADD1 to ADDm to generate test data patterns P_DATA1 to P_DATAn has been introduced in the conventional art.

However, because the number of available test data patterns depends on the number of available addresses and input data, and the addresses must be varied according to the test data patterns, there may be compatibility issues of using the address key method with existing package test patterns.

FIG. 3 illustrates another conventional memory device 300 which may include a selector 310 to select either data DOI output from a memory cell (not shown) in a normal mode or select a test result signal TRS in a test mode, in response to a mode control signal MODE. The memory device 300 may further include an output buffer 320, and logic devices ENR1 to ENR16, and N1 to generate the test result signal TRS.

With reference to FIG. 3, a "merged DQ" method to reduce the number of I/O pins through which test results are output will be described. In the merged DQ method, test data values T_DATA1 to T_DATA16 stored in internal registers (not shown) may be respectively compared with data DOI1 to DOI16 read from memory cells, a pass/fail (P/F) may be determined from the comparison, and the determined result may be output through the output buffer 320. By using the merged DQ method, it may be possible to reduce the number of I/O pins and output buffers 320 during a test mode.

By respectively comparing test data values T_DATA1 to T_DATA16 stored in internal registers (not shown) with data DOI1 to DOI16 read from memory cells using logic devices ENR1 to ENR16, and N1, if at least one memory cell is defective, a test result signal TRS indicating the defect may be generated.

However, in the merged DQ method, problems still exist in that the method requires a predetermined command to change test data values T_DATA1 to T_DATA16 stored in internal registers (not shown) to be respectively compared with read data DOI1 to DOI16. In addition, it may be difficult to change the test data values T_DATA1 to T_DATA16. Accordingly, compatibility issues with test data patterns used with current test method still exists.

SUMMARY OF THE INVENTION

In an example embodiment of the present invention, a semiconductor memory device having a test circuit includes a switch unit adapted to transfer data or transfer test data to memory cells in response to a mode control signal, a plurality of storage units respectively adapted to store the test data in response to an input control signal, and a selection unit adapted to apply one of the test data to the switch unit in response to the input control signal.

In another example embodiment, a semiconductor memory device having a test circuit includes a plurality of selectors adapted to transfer internal data to corresponding output buffers or transfer test result signals in response to a mode control signal, and a plurality of test units adapted to determine whether the internal data are the same as the corresponding test data and generate the test result signals thereof, wherein the test data corresponding to the plurality of test units is different from each other.

And in another example embodiment, a method of testing memory cells includes transferring internal data or transferring test result signals in response to a mode control signal, and determining whether the internal data are the same as corresponding test data and generating the test result signals thereof, wherein the test data corresponding to the plurality of test units is different from each other.

BRIEF DESCRIPTION OF THE DRAWINGS

The present invention will become more apparent with the description of the detail exemplary embodiments thereof with reference to the attached drawings in which.

DETAILED DESCRIPTION OF THE INVENTION

Hereinafter, example embodiments of the present invention will be described in detail with reference to the appended drawings. Like reference numbers refer to like components throughout the drawings.

Figure 1:
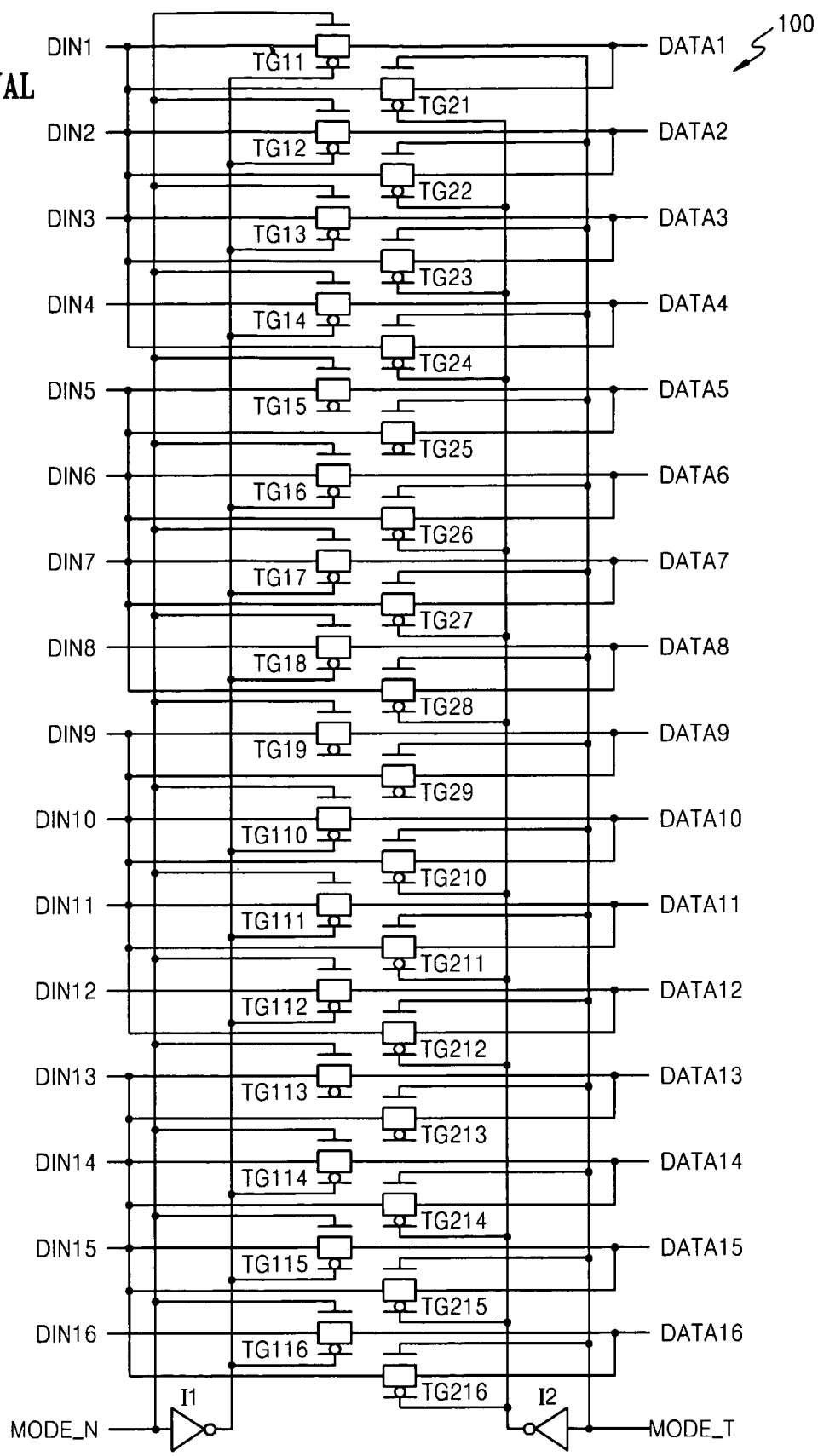
FIG. 1 illustrates a circuit diagram of a conventional semiconductor memory device.
Figure 2:
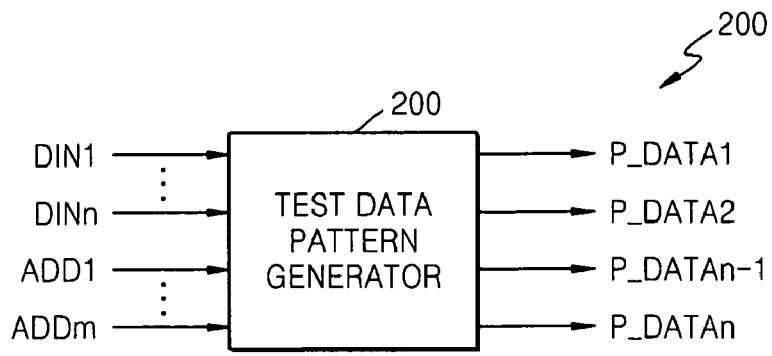
FIG. 2 illustrates a conventional test data pattern generator.
Figure 3:
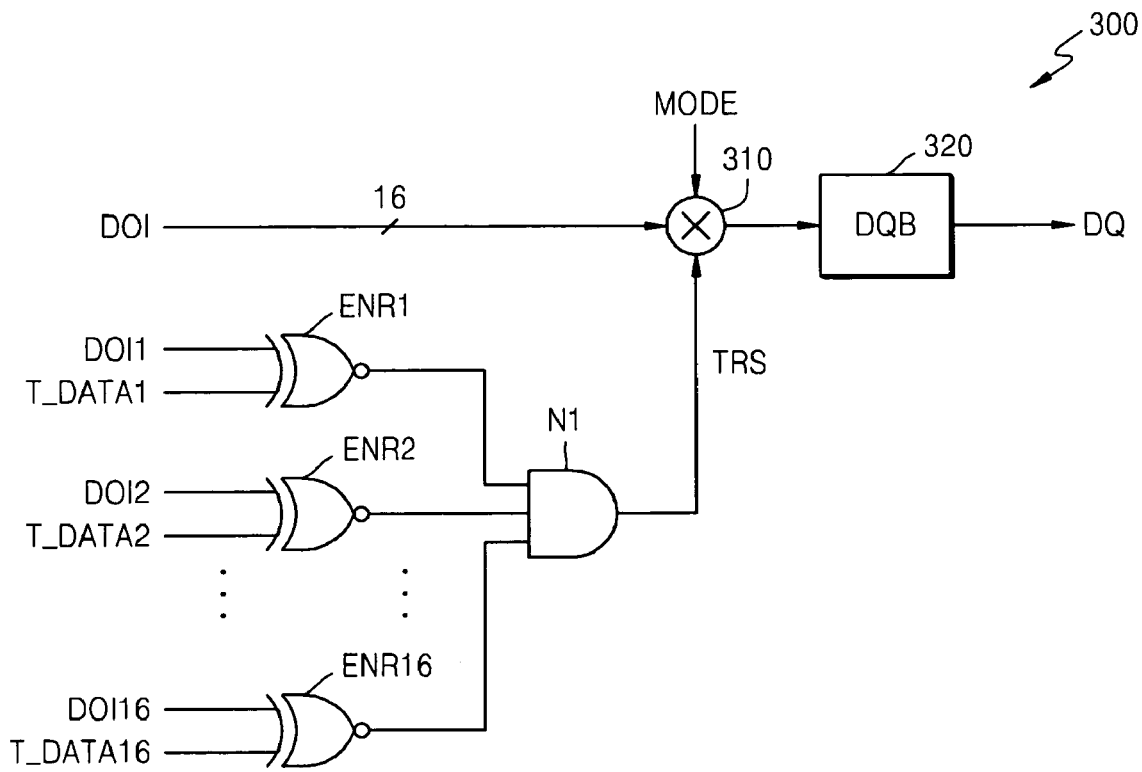
FIG. 3 illustrates a conventional memory device adapted to perform a merged DQ method for outputting test results for memory cells.
Figure 4:
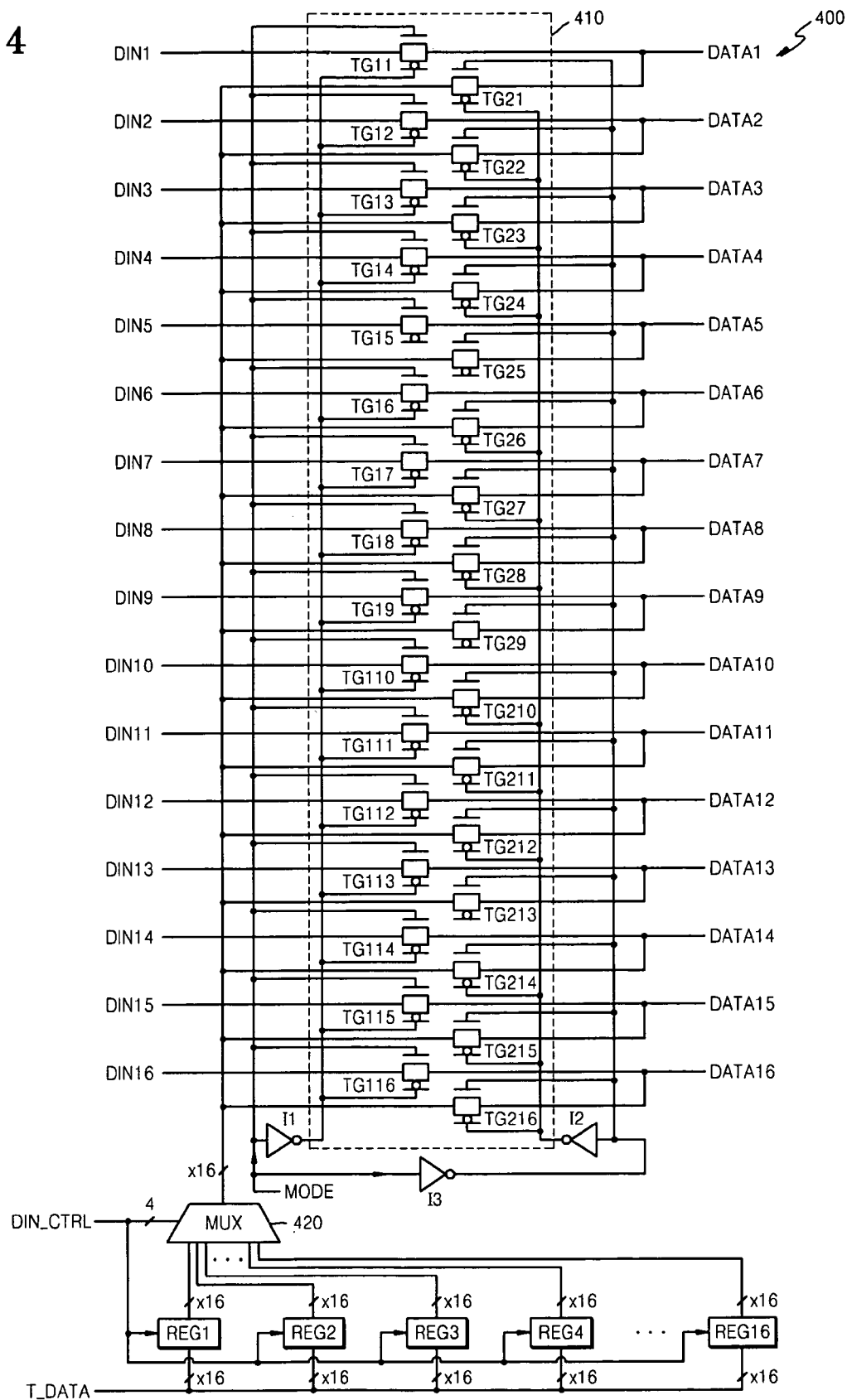
FIG. 4 is a circuit diagram of a semiconductor memory device according to an example embodiment of the present invention.

FIG. 4 is a circuit diagram of a memory device 400, in which memory cells may be tested using several different test data patterns, according to an example embodiment of the present invention.

Referring to FIG. 4, the memory device 400 may include a switch unit 410, a plurality of storage units REG1 to REG16, and a selector 420.

The switch unit 410 may transfer m bits of data DIN1 to DIN16 or m bits of test data T_DATA received in response to a mode control signal MODE to memory cells (not shown), wherein m is a natural number. For the convenience of description but not limited thereto, in this example embodiment, m is 16.

The switch unit 410 may include a plurality of first transmission gates TG11 to TG116, which may transmit 16 bits of data DIN1 to DIN16 in response to a first mode control signal MODE, and a plurality of second transmission gates TG21 through TG216, which may transmit 16 bits of test data T_DATA in response to a second mode control signal MODE.

When the semiconductor memory device 400 is in a normal mode, the first transmission gates TG11 to TG116 may be turned on and transmit data DIN1 to DIN16. In the present embodiment, the first mode control signal MODE may be high when the memory device 400 is in a normal mode. However, in another example embodiment of the present invention, in a normal mode, the first mode control signal may be low. The second transmission gates TG21 to TG216 may be turned on when the memory device 400 is in a test mode and transmit test data T_DATA. In the present embodiment, the second mode control signal MODE may be low when the memory device 400 is in the test mode. However, in another example embodiment of the present invention, in a test mode, the second mode control signal may be low. If the first transmission gates TG11 to TG116 may be turned on, the second transmission gates TG21 to TG216 may be turned off. If the second transmission gates TG21 to TG216 are turned on, the first transmission gates TG11 to TG16 are turned off.

The plurality of storage units REG1 to REG16 may each respectively store 16 bits of test data T_DATA in response to n bits of an input control signal DIN_CTRL. The input control signal DIN_CTRL may be a partial bit(s) of the data DIN1 to DIN16. The number of the storage units REG1 to REG16 may be $2^n$ or less, wherein $2^n$=m. For example, the number of the storage units REG1 to REG16 may be 16 or less and the input control signal DIN_CTRL may be 4 bits of data DIN1 to DIN16. Each of the storage units REG1 to REG16 may be a register.

The selector 420 applies test data T_DATA stored in one of the plurality of storage units REG1 to REG16 to the switch unit 410 in response to an input control signal DIN_CTRL. The test data T_DATA may be applied to the second transmission gates TG21 to TG216 and written to a corresponding memory cell (not shown).

Test data T_DATA stored in the plurality of storage units REG1 to REG16 may be different from each other. The selector 420 may be a multiplexer.

First, before performing a write operation, test data T_DATA may be stored in the storage units REG1 to REG16 in a test mode. Since an input control signal DIN_CTRL may have 4 bits and each of the storage units REG1 to REG16 may store 16 bits (the same number of bits of data DIN1 to DIN16 applied to a memory cell) of test data T_DATA, the 16 bits of the test data T_DATA may be divided and written four times to a storage unit.

In order to store test data T_DATA in all the storage units REG1 to REG16, 4×16 write operations may be performed. Through this initialization procedure, test data T_DATA to be used in the test mode may be stored in advance in the storage units REG1 to REG16. The test data T_DATA stored in the storage unit REG1 to REG16 may be different from each other.

The number of the storage units REG1 to REG16 may be a maximum of 16. The selector 420 may select one of outputs of the storage units REG1 to REG16 using a combination of bits of an input control signal DIN_CTRL when test data T_DATA is actually written. The selected output may be written to a corresponding memory cell via a corresponding one of the second transmission gates TG21 through TG216.

As necessary, the test data T_DATA stored in the storage units REG1 to REG16 may be readjusted during a test. The memory device 400 shown in FIG. 4 may diversify test data patterns for the testing memory cells using a simple circuit configuration.

Figure 5:
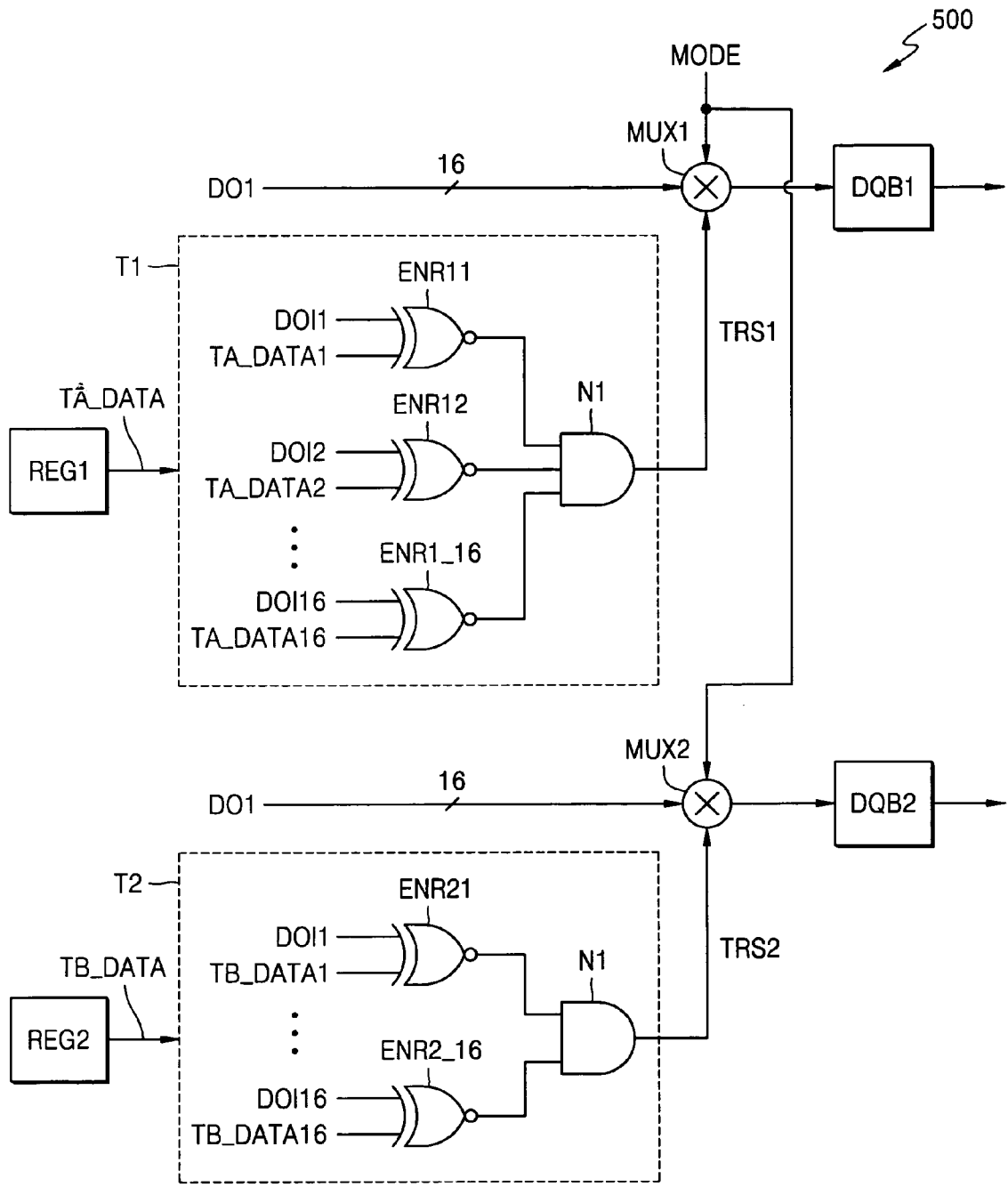
FIG. 5 is a circuit diagram of a memory device in which memory cells may be tested using various test data patterns, according to another example embodiment of the present invention.

FIG. 5 is a circuit diagram of a memory device 500 of another example embodiment of the present invention.

Referring to FIG. 5, the memory test circuit 500 may include a plurality of selectors MUX1 and MUX2 and plurality of test units T1 to T2.

The selectors MUX1 and MUX2 may transfer m bits of internal data DOI to corresponding output buffers DQB1 and DQB2 or may transfer test result signals TRS1 and TRS2, which contain information of whether memory cells (not shown) have defects, to the corresponding output buffers DQB1 and DQB2, in response to a mode control signal MODE.

Here, m is a natural number. In the present example embodiment and for the convenience of description, m is 16. Also for convenience and purposes of explanation, FIG. 5 depicts a memory device having 2 selectors MUX1 and MUX2 and 2 test units T1 and T2, but the number of selectors and test units are not limited thereto.

If the memory device 500 is in a normal mode, the selectors MUX1 and MUX2 may output internal data DOI received from memory cells in response to a mode control signal MODE.

If the semiconductor memory device 500 is in a test mode, the selectors MUX1 and MUX2 may output test result signals TRS1 and TRS2 received from the test units T1 and T2 in response to the mode control signal MODE.

The test units T1 and T2 may determine whether 16 bits of internal data DOI1 to DOI16 are the same as corresponding 16 bits of test data TA_DATA$_1$ to TA_DATA16, TB_DATA$_1$ to TB_DATA16, and may generate test result signals TRS1 to TRS2.

That is, the test unit T1 may determine whether the internal data DOI1 to DOI16 are the same as the test data TA_DATA1 to TA_DATA16, and may generate the test result signal TRS1 based on the determination. If the internal data DOI1 to DOI16 are the same as the test data TA_DATA1 to TA_DATA16, the test result signal TRS1 may indicate whether the corresponding memory cells are normal.

Also, the test unit T2 may determine whether the internal data DIO1 to DOI16 are the same as the test data TB_DATA1 to TB_DATA16, and may generate the test result signal TRS2. If the internal data DOI1 to DOI16 are the same as the test data TB_DATA1 to TB_DATA16, the test result signal TRS2 may also indicate whether the corresponding memory cells are normal.

Here, the test data TA_DATA1 to TA_DATA16 corresponding to the test unit T1 are different from the test data TB_DATA1 to TB_DATA16 corresponding to the test unit T2. In other words, by respectively comparing the same internal data D101 to DOI16 with different test data TA_DATA1 to TA_DATA16, TB_DATA1 to TB_DATA16, it may be possible to diversify test data patterns. Such test operations may be simultaneously performed in a single clock cycle.

Each of the test units T1 and T2 may include first through sixteenth Exclusive OR devices, and an AND device.

For example, the first to sixteenth Exclusive OR devices ENR11 through ENR1_16 of the first test unit T1 respectively may perform Exclusive OR operation of 16 bits of internal data DOI1 to DOI16 with corresponding 16 bits of test data TA_DATA1 to TA_DATA16. If the internal data DOI1 to DOI16 are the same as the test data TA_DATA1 to TA_DATA16, the Exclusive OR devices ENR11 to ENR1_16 may generate output high level signals. If the internal data DOI1 to DOI16 are different from the test data TA_DATA1 to TA_DATA16, the Exclusive OR devices ENR11 to ENR1_16 may generate output low level signals, and the AND device N1 may generate a test result signal TRS1 having a low level. The low level test result signal TRS1 may indicate that a defect exists in a test memory cell.

Accordingly, if at least one bit of the internal data DOI1 to DOI16 is different from a corresponding bit of the test data TA_DATA1 to TA_DATA16, the Exclusive OR devices ENR11 to ENR1_16 may generate output signals with a low level, and the AND device N1 may generate a test result signal TRS1 with a low level. The test result signal TRS1 with the low level may indicate that a defect exist in the tested memory cells.

The configuration and operation of T2 may be similar to the operation of T1, therefore, a detail configuration and operation descriptions of T2 are omitted.

The semiconductor memory device 500 may include storage units REG1 to REG-n storing test data TA_DATA1 to TA_DATA16, TB_DATA1 to TB_DATA16. The test data TA_DATA to TA_DATA16 and TB_DATA1 to TB_DATA16 respectively stored in the storage units REG1 and REG2 may be different from each other.

The selectors MUX1 and MUX2 may simultaneously output test result signals TRS1 and TRS2 in synchronization to a clock signal. Accordingly, two different test data TA_DATA1 to TA_DATA16 and TB_DATA1 to TB_DATA16 may be stored in advance in the storage units REG1 and REG2, and internal data DOI1 to DOI16 may be compared with the different test data TA_DATA1 to TA_DATA16 and TB_DATA1 to TB_DATA16 in the same clock cycle.

By simultaneously outputting test result signals TRS1 and TRS2 corresponding to comparison results through corresponding output buffers DQB1 and DQB2, the semiconductor memory device 500 may determine whether two different test data TA_DATA1 to TA_DATA16 and TB_DATA1 to TB_DATA16 are equal to the internal data DOI1 to DOI16 in a clock cycle. This method may be expansively applied to perform a plurality of pass/fail (P/F) determinations in a clock cycle.

As described above, in a semiconductor memory device according to example embodiments of the present invention, it may be possible to test memory cells using various test data patterns and simultaneously receive test results using the various test data.

While example embodiments of the present invention have been shown and described, it will be understood by those of ordinary skill in the art that various changes in form and details may be made therein without departing from the scope of the example embodiments of the present invention.

What is claimed is:

1. A memory device, comprising:
   a switch unit adapted to transfer at least test data to memory cells in response to a mode control signal;
   a plurality of storage units respectively adapted to store the test data in response to an input control signal, each test data including a plurality of bits; and
   a selection unit adapted to select the test data from one of the plurality of storage units and apply the selected test data to the switch unit in response to the input control signal.

2. The memory device of claim 1, wherein if the test data are m bits and the input control signal is n bits, the number of the plurality of storage units is $2^n$ or less and $2^n=m$.

3. The memory device of claim 1, wherein the test data stored in the plurality of storage units are different from each other.

4. The memory device of claim 1, wherein the plurality of storage units are registers.

5. The memory device of claim 1, wherein the input control signal is partial bits of the data.

6. The memory device of claim 1, wherein the selection unit is a multiplexer adapted to receive outputs of the plurality of storage units and adapted to select and output one of the outputs in response to the input control signal.

7. The memory device of claim 1, wherein the switch unit comprises:
   a plurality of first transmission gates adapted to transfer the data in response to a first mode control signal; and
   a plurality of second transmission gates adapted to transfer the test data in response to a second mode control signal;
   wherein if the first transmission gates are turned on, the second transmission gates are tuned off, and, if the second transmission gates are turned on, the first transmissions gates are turned off.

8. A memory device, comprising:
   a plurality of selectors adapted to transfer test result signals in response to a mode control signal; and
   a plurality of test units adapted to determine whether internal data are the same as corresponding test data and generate the test result signals thereof;
   wherein the test data corresponding to the plurality of test units is different from each other.

9. The memory device of claim 8, wherein each of the plurality of test units comprises:
   a plurality of Exclusive OR devices adapted to perform Exclusive OR operations on the internal data and the corresponding the test data; and
   an AND device adapted to perform an AND operation on outputs of the plurality of Exclusive OR devices and generate the test result signal.

10. The semiconductor memory device of claim 8 wherein the number of the selectors and the number of the test units are 2.

11. The semiconductor memory device of claim 8, wherein the plurality of selectors are multiplexers.

12. The semiconductor memory device of claim 11, wherein the plurality of multiplexers are adapted to transfer the internal data in response to a first mode control signal and transfer the test data in response to a second mode control signal.

13. The semiconductor memory device of claim 8, further comprising a plurality of storage units adapted to store the test data.

14. The semiconductor memory device of claim 8, wherein the plurality of selectors simultaneously output the test results signals in synchronization to a same clock signal.

15. A method testing memory cells, comprising:
   transferring test results signals in response to a mode control signal; and
   determining whether internal data are the same as corresponding test data and generating the test result signals thereof;
   wherein the test data corresponding to the plurality of test units is different from each other.

16. The method of claim 15, further comprising:
   transferring the internal data in response to a first mode control signal; and transferring the test data in response to a second mode control signal.

17. The method of claim 15, wherein a plurality of the test result signals is output in synchronization to a clock signal.

* * * * *